United States Patent [19]

Field, Jr.

[11] Patent Number: 5,266,425
[45] Date of Patent: Nov. 30, 1993

[54] SELF-ALIGNED PROCESS FOR APPLYING COLOR FILTERS TO ELECTRONIC OUTPUT COLOR IMAGE INTENSIFIERS

[75] Inventor: Robert J. Field, Jr., Fincastle, Va.

[73] Assignee: ITT Corporation, New York, N.Y.

[21] Appl. No.: 891,229

[22] Filed: May 29, 1992

[51] Int. Cl.⁵ ............................................. G03F 9/00
[52] U.S. Cl. ......................................... 430/7; 430/30; 430/22; 250/214 VT; 257/440; 257/443; 358/44
[58] Field of Search ...................... 430/321, 7, 22, 24, 430/27, 30; 358/44; 252/440, 433, 294; 250/214 VT

[56] References Cited

U.S. PATENT DOCUMENTS

| | | | |
|---|---|---|---|
| 4,053,905 | 10/1977 | Schlafer | 430/24 |
| 4,053,906 | 10/1977 | Schultz | 430/24 |
| 4,196,010 | 4/1980 | Sander | 430/7 |
| 4,315,978 | 2/1982 | Hartman | 257/440 |
| 4,339,514 | 7/1982 | Biber | 430/7 |
| 4,374,325 | 2/1983 | Howorth | 250/214 VT |
| 4,383,017 | 5/1983 | Hirofumi et al. | 430/7 |
| 4,911,733 | 3/1990 | Matsumoto et al. | 250/492.1 |
| 4,942,103 | 7/1990 | Reithel et al. | 430/7 |
| 4,942,110 | 7/1990 | Genovese et al. | 430/311 |
| 4,977,048 | 12/1990 | Waldo | 430/22 |
| 5,087,809 | 2/1992 | Jackson | 358/44 |

OTHER PUBLICATIONS

Funk et al "Low Light Level Color Camera w/one CCD" SPIE vol. 1243 (1990) pp. 72-80.

Primary Examiner—Richard L. Schilling
Assistant Examiner—M. Angebranndt
Attorney, Agent, or Firm—Arthur L. Plevy; Patrick M. Hogan

[57] ABSTRACT

A method for fabricating a stripe color filter for the input of an image intensifier having a color-interpretive CCD output includes ascertaining CCD subpixel-to input coordinate correlation by test illumination with a positioning laser having low power. Based upon the correlation data assembled, light sensitive filter media, such as color tinted photoresist is exposed at those locations corresponding to like-color CCD subpixels. The media is then developed to form filter media. Subsequent coatings of photoresist of the next color are applied and exposed etc.

30 Claims, 7 Drawing Sheets

SELF-ALIGNED PROCESS FOR APPLYING COLOR FILTERS TO ELECTRONIC OUTPUT COLOR IMAGE INTENSIFIERS

FIELD OF THE INVENTION

The present invention relates to image intensifier devices and methods for producing same and, more particularly, to an intensifier which preserves the input image color composition and which uses a CCD camera coupled to the output of the intensifier.

BACKGROUND OF THE INVENTION

Image intensifiers are inherently color-blind. The cathode material initially produces only one electron per photon event, no matter what the color of the photon, if the photon is within the range of spectral sensitivity. Therefore, the number of electrons and the electron energies are amplified without regard to the color of the original photons. The image intensifier ($I^2$) output is a direct view of a monochromatic (usually green) phosphor, or a monochrome television signal using a CCD camera either coupled to the phosphor or driven by the amplified electrons (EB-CCD).

There is a need for color image intensifiers, both for direct view and for electronic output. Several applications may require color image intensification, such as when the illumination contrast is poor, but the color contrast is good, when color is required for object identification, or when a color format is preferred (as in TV news reporting). The following are examples of instances when color image intensification is desirable.

Imaging for surgery (where too much heat and light can dry out tissue)

For microscopes used on light-sensitive samples;

Intrusive medical imaging;

Low-light color video camera (for law-enforcement, television, or consumer markets)

Infrared image conversion (for real-time natural resource or pollution surveying); and Night surveillance cameras.

This invention disclosure details a manufacturing process for electronic output color image intensifiers (or light-intensified color TV cameras).

A common method of generating a color video signal from a CCD camera is to apply narrow stripe color filters directly to the CCD image plane, so that adjacent charge packets are associated with different colors. Charge packets from different colors are sorted and recombined electronically into a color video signal. The same scheme can be used to make a color $I^2$ camera, as described in "Low Light Level Color Camera with One CCD", SPIE Electron Image Tubes and Image Intensifiers, 1990. The same type of CCD is used, except the narrow stripe color filters are left off the CCD. The filters are instead applied to the input image plane of the $I^2$ parent device, and the CCD is coupled to the $I^2$ output. The input stripe filters can be located at a secondary image plane, applied to a fiber optic faceplate, or sandwiched between the faceplate and photocathode. The CCD can be coupled to the $I^2$ phosphor output using fiber optics, or could be installed in the $I^2$ device for direct electron bombardment (EB-CCD).

There are several difficulties with this method, viz., it is very difficult to get good alignment and registration between the CCD rows or columns at the $I^2$ output with the stripe filters at the $I^2$ input. The filter set must have precise stripe spacing and angle with respect to the CCD. Any distortion in the tube or coupler results in bad alignment and registration between the filter stripes and CCD columns, which produces alias patterns and bad color. Further, the CCD pixel size must be matched to the parent $I^2$ device resolution. Typical CCD cameras have pixels (and filter stripes) which are narrower than the resolution of typical $I^2$ tubes. As a result, light coming through one filter stripe causes in an output signal on several adjacent columns of the CCD.

The first problem, relating to alignment and registration, can be overcome by having a precisely-dimensioned filter set which can be positioned and adjusted in front of the input while the device is operating. The most practical method is to use a fiber optic faceplate so that the image plane is accessible, and the filter set is external to the tube. Alternately, the precisely-dimensioned filter set can be fixed on the image plane (possibly sandwiched between the faceplate and cathode), and the CCD can be coupled to the output by a distortion-free fiber optic, so that the final CCD position can be adjusted while the system is operating. These methods are discussed in "Low Light Level Color Camera with One CCD", SPIE Electron Image Tubes and Image Intensifiers, 1990.

The last problem relating to resolution of the $I^2$ can be overcome by using a demagnifying invertor $I^2$ tube or an $I^2$ tube with a demagnifying fiber optic taper at the output. This allows a small CCD to be matched to the full area of a larger $I^2$ device with larger filter stripes. Unfortunately, this makes the first two problems much worse due to image distortions. Distortions prevent an equally-spaced straight-line stripe filter set from aligning with the CCD. Distortions require an inversely distortion-matched filter set.

It is, therefore, an object of the present invention to provide a color preserving $I^2$ utilizing input filters which are precisely aligned with corresponding CCD pixels receiving the $I^2$ output signal.

SUMMARY OF THE INVENTION

The problems and disadvantages of known techniques for positioning filter stripes on the input of color image intensifiers utilizing CCD color-interpretive output are overcome by the present inventive method, which includes the steps of ascertaining CCD subpixel-to-input coordinate correlation; a light sensitive color filter media positioned proximate said input is then exposed and developed in accordance with the correlation ascertained.

DETAILED DESCRIPTION OF THE PREFERRED EMBODIMENTS

Figure 1:
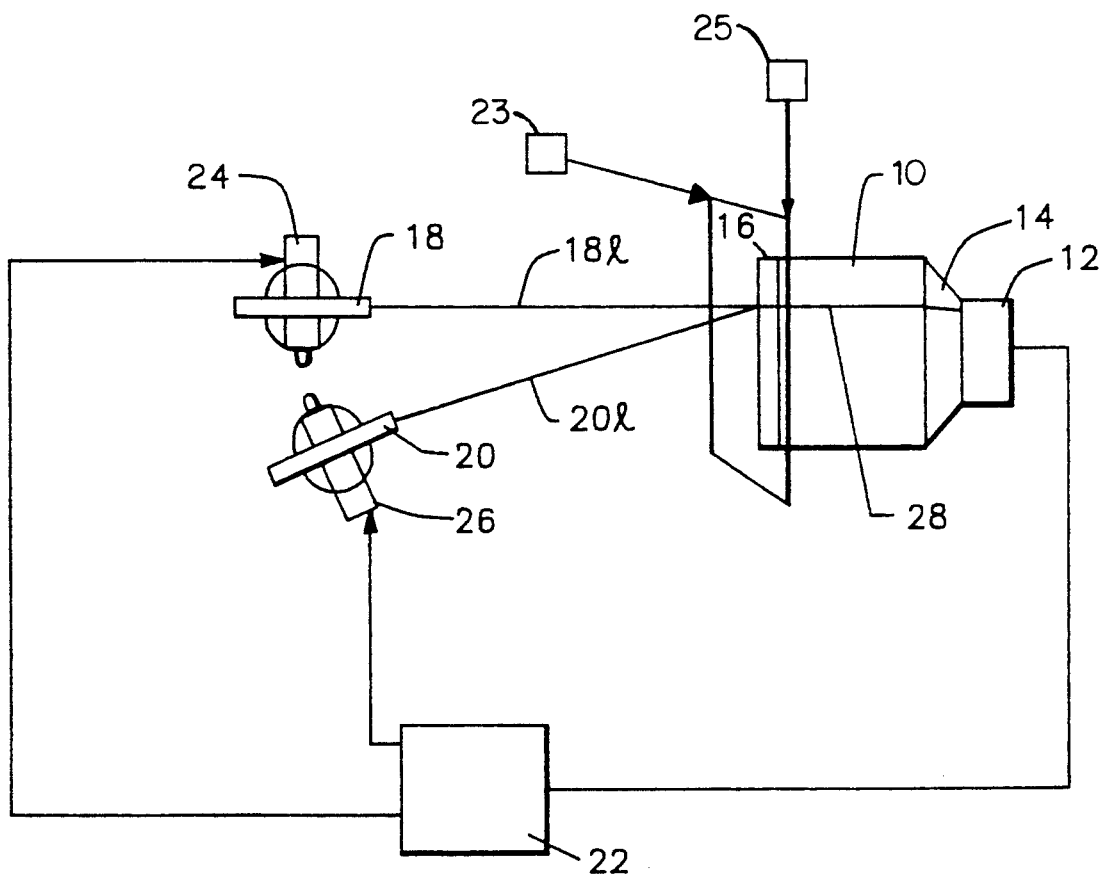
FIG. 1 is a diagram illustrating the preparation of a color filter for an image intensifier/CCD combination in accordance with the present inventive method.

Referring to FIG. 1, an image intensifier ($I^2$ device) 10 is coupled with a CCD 12 which is compatible with the color stripe method, but without any color stripes actually applied to the CCD surface. A simple frame-transfer CCD is preferred over one which has on-chip color video signal processing. The CCD 12 area can be matched to the larger $I^2$ 10 active area by using a demagnifier, preferably a tapered fiber optic coupler 14, although an electrostatically focused image on an EB-CCD (electron-bombarded) in the tube is also possible. The tube preferably has a fiber optic faceplate so that the self-aligned distortion-matched filter set can be applied directly to the faceplate.

The self-alignment technique uses a photographic technique in which pigmented photoresist 16 is applied to the faceplate of the $I^2$ 10 and exposed in the correct locations to form the filter set. The photoresist layer 16 is greatly enlarged for the purpose of illustration. Three different pigments are used, requiring three photoresist applications and exposures, to produce the three colors of the filter. Alternately, a color transparency film can be positioned on the faceplate and exposed in a manner to produce all three colors at the correct positions. This is followed by development in place, or separation, development and replacement of the completed filter on the faceplate. Keyed guides ensure registration of the replaced color transparency to the faceplate. A unique self-aligned and distortion-matched filter set is produced for each color $I^2$ device. Three methods of exposing the filters will now be described.

In accordance with a first method, a fully functioning electronic output $I^2$ tube 10 without color filters is put onto an optical bench where it can be scanned repeatably with one or more lasers 18, 20. The scanning is controlled by a computer 22, which also reads the electronic CCD 12 output. The computer 22 moves the laser beam(s) 18 and 20 across the input faceplate of the $I^2$ 10 in steps smaller than the final filter stripe width. The lasers 18 and 20 are, e.g., gimbal mounted to permit displacements in the x and y directions via suitable actuating motors/transducers 24 and 26. Alternatively, the laser beams could be fixed while a motorized x-y stage moves the $I^2$ in two dimensions, via activating motors/transducers 23 and 25. At each step the computer 22 reads the frame from the CCD and determines if the resultant intensified beam 28 is positioned on a red, green, or blue subpixel of the CCD 12 after passage through reducer 14.

In the case of pigmented photoresist, the computer will expose the photoresist at that point if, for example, the photoresist pigment is red and the beam is at a red subpixel. (Depending on whether positive or negative photoresist is used, the computer may determine not to expose that point.) One of the laser beams, e.g., 18 is used as a locating or positioning laser beam which is either too weak or of the wrong frequency to expose the photoresist, and a stronger pulse or a pulse from a different laser providing an exposing beam 20 is required for exposure. This arrangement is particularly appropriate due to the fact that even very weak input signals will be sensed by the CCD 12 owing to the intensification of the signal by the $I^2$ 10. It is important that the positioning laser 18 and the exposing laser 20, transducer 24, 26, positions be correlated to each other such that the lasers are both focused on the same point on the filter layer (and the resultant beams 28 consequently on the same CCD subpixel). This can be accomplished in a number of ways. For example, a table of laser positions and associated subpixel identity can be prepared experimentally by stepping through each position with each laser using the $I^2$/CCD combination without having the filter layer in place. Alternatively, the relationship can be calculated mathematically based upon a few sample points.

In the case of color transparency film, the computer will pulse a higher power laser beam of the appropriate color to expose the filter at that point. Note again that the locating laser beam is too weak to expose the film.

The computer will then stop the beam to the next position, eventually covering the whole surface in a raster scan. In the case of photoresist, the raster scan will have to be repeated with each of the three pigmented photoresists. The color transparency film requires only one scan, but three colors of exposure lasers.

Figure 2:
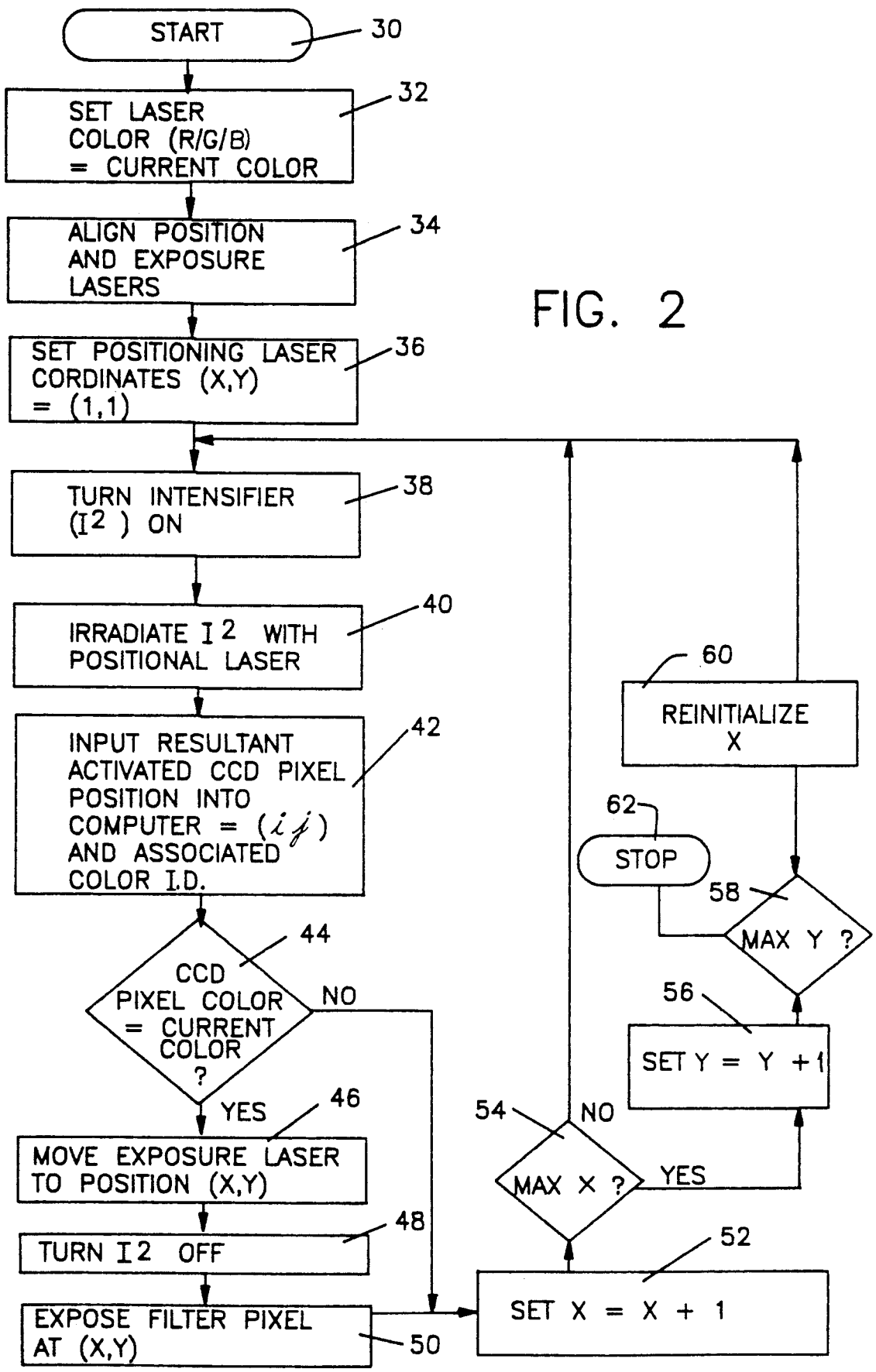
FIG. 2 is a flowchart putting forth exemplary steps in accordance with a first method of the present invention, i.e., the raster scan method.

In either case, a filter is built which has the correct colors in the correct places to match the distortion of the $I^2$ tube 10 and demagnifying coupler 14. The foregoing process is depicted in FIG. 2. In the case of the exposure of tinted photoresist which is exposed with a common laser, that is, each color is exposed with a common laser, the positioning laser is shone upon a particular input screen coordinate (x,y) and a particular subpixel (i,j) of the CCD is activated, and the decision (44) whether or not the (x,y) position on the input screen should be exposed (50) is based upon whether the color identity of the CCD subpixel matches the tint of the current photoresist. When color film is used as the input filter media, the selection of laser color (32) as the current color represents selecting from one of at least two lasers having different colored beams.

In step 34 the positioning and exposure lasers are aligned as described above so that the position laser and the exposure laser both focus upon the same input coordinates as each coordinate is processed. The positioning laser coordinates are initialized to be the first coordinate 36. Coordinate (1,1) might be the upper left hand corner of the input screen or could as well be the lower right hand corner or the upper right hand corner, etc., however, some point is taken as the starting point for processing the input filter and this initial starting point is designated (1,1). The intensifier device $I^2$ is then turned on 38 such that when the input is irradiated with the positional laser 40, which has been described as too weak to develop the photosensitive filter media, the intensifier intensifies the weak signal such that a CCD subpixel is activated by the positional laser beam focused upon the input screen. In step 42 the CCD subpixel which is activated as a result of irradiating the input screen with the positional laser is sensed upon and identified by its position in the CCD array and also its color identification, i.e., whether it is a red, green or blue subpixel. This information is supplied to the computer controller. In step 44 the color identity of the subpixel activated by the positional laser is checked to ascertain if it is the current color which is being exposed. If it is, the exposure laser is moved to the position (x,y) upon which the positioning laser is presently focused and which results in the activation of the CCD subpixel (i,j) 46. The exposure laser can be moved in coordination with the positioning laser or it can be moved as a separate step, as shown in FIG. 2. The intensifier is then turned off, step 48, because it is not necessary to intensify the exposure laser signal when the input filter is exposed at position (x,y) 50. The x coordinate of cartesian coordinates (x,y) for the positioning laser is then incremented such that the next sequential position on the input screen can be processed, step 52. If the x coordinate has reached a maximum, i.e., the edge of the input screen has been reached 54, the next line down is selected by incrementing the y coordinate 56 so that the next line of input filter coordinates can be processed. In the eventuality 58 that the y coordinate of the input filter pixels is maximized, that is, the entire screen has been processed, the processing is stopped 62, otherwise if the entire screen has not been processed, the x coordinate is reinitialized to reposition the positioning laser at the beginning of the next line 60. The entire process of FIG. 2 is repeated for each color. This process is time consuming, due to the large number of positions or steps to be tested, and the integration, readout, and processing time at each position. For example, 250×400 pixels, with 3 subpixels per pixel, perhaps 4 step positions per subpixel, and 25 msec per frame, would require 500 minutes per raster scan. The mapping technique described below is much faster.

In accordance with a second method of the present invention, rather than exhaustively identifying each subpixel illuminated by testing each position with the positioning laser and exposing the filter media based upon that identity, the positional relationship between the positioning laser transducer coordinates and the associated subpixel location can be predicted based upon a representative sample of test points and a mapping created by a suitable algorithm.

As before, a fully functioning electronic output $I^2$ device 10 is put on an optical bench where it can be scanned by one or more lasers 18 and 20. This time the computer positions the locating laser on a selected representative array of points covering the faceplate, one point at a time. At each point the computer 22 pulls the frame from the CCD 12 and determines the precise location of that point on the CCD. The array of points is dense enough, e.g., 1% to 10% of total points so that a suitable algorithm can produce a mapping between the laser scan driver transducer positions and the CCD subpixel locations, this mapping including the effects of distortion. Once this is done, the computer can determine what laser scan positions correspond to red, green, or blue stripes, and the computer can drive the scanner to position the laser to expose these stripes. These can be exposed as continuous stripes, or the surface can be scanned in a raster fashion with a pulsing laser to expose the stripes.

Figure 3:
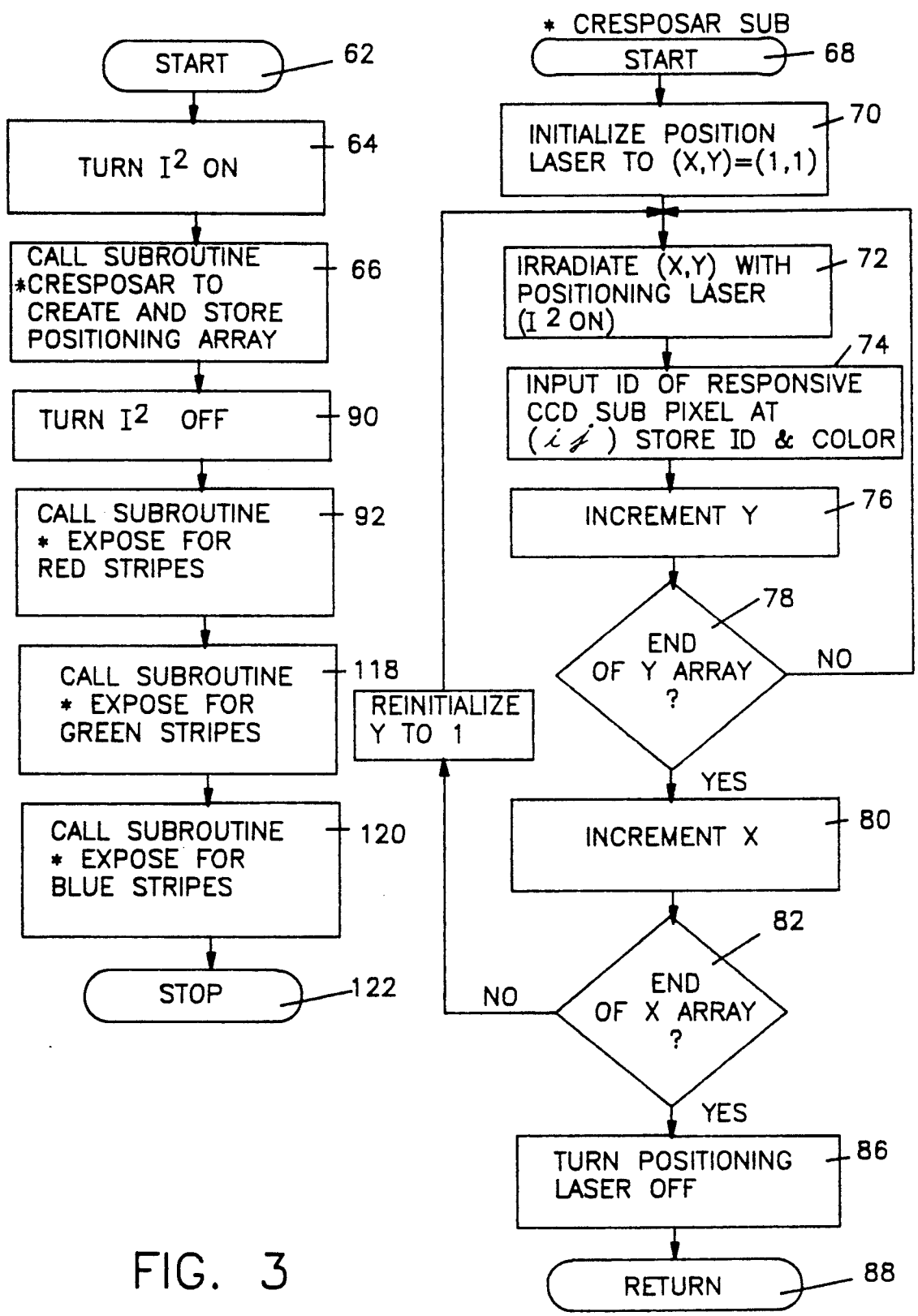
FIG. 3 is a flowchart setting forth exemplary steps for performing a second method in accordance with the present invention, i.e., the mapping exposure technique including a flowchart of the *CRESPOSAR subroutine.
Figure 4:
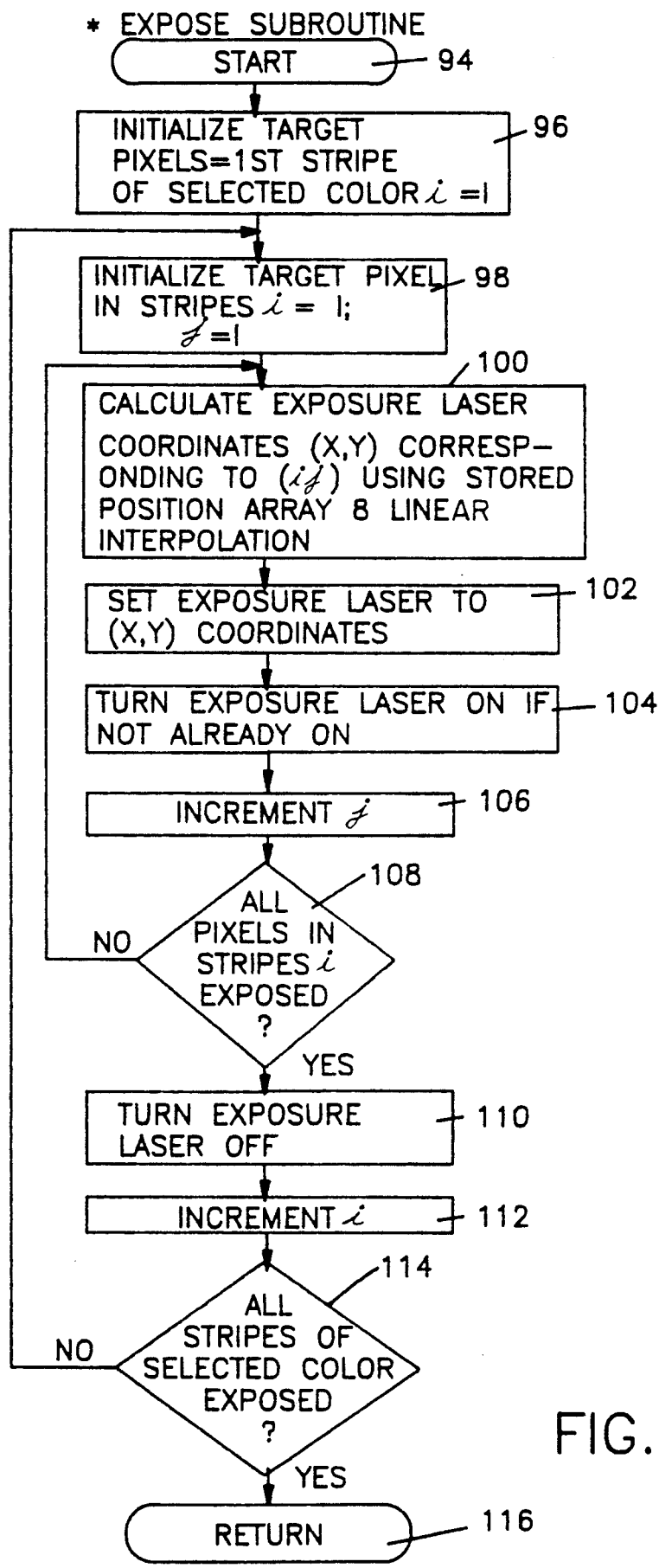
FIG. 4 is a flowchart of the *EXPOSE subroutine called out by the flowchart in FIG. 3.

Considerable time is saved compared to the previously described raster technique. Instead of several steps and exposures per subpixel, there could be one locating array point per 10-100 subpixels. For example, 250×400 pixels, 3 subpixels per pixel, 1 locating point per 12 subpixels, and 25 msec per frame would require only 10 minutes per filter. This second method is depicted in FIGS. 3 & 4. It should be observed that the main program starting at 62 calls two subroutines *CRESPOSAR shown in FIG. 3 and *EXPOSE shown in FIG. 4. The mapping exposure technique after starting 62 requires the intensifier $I^2$ to be turned on 64 in preparation for irradiating the input screen with the positioning laser. A subroutine which has been called *CRESPOSAR for creating and storing the positioning array is called at 66. After starting the subroutine at 68, the position of the positioning laser is initialized to the first position (1,1) which is any arbitrary starting point on the input screen/filter. The positioning laser is then turned on and the coordinate (1,1) is irradiated with the positioning laser 72. At 74 the CCD subpixel which is responsive to the signal of the positioning laser, as interpreted by the operating image intensifier, is identified by its location (i,j) in the CCD array and its color attribute is also identified and stored in the computer controller 22 at step 74. The y coordinate of the input screen position is incremented in preparation for processing the next input position. It is irrelevant how the position (x,y) is incremented for processing the entirety of the input screen/filter. The only requirement is that there is an orderly process for incrementing each coordinate of the array such that the entire input filter screen is processed. It should be observed, however, that the size of the increment of x and y which is utilized in steps 76 and 80 determines the size of the sample of points for which data is compiled. The larger the increments of x and y, the smaller the sample which is taken. Having completed the testing of points with the positioning laser, the positioning laser is turned off 86 and the subroutine is concluded by returning 88 to the calling program. Having determined the correlation for a representative set of points with the positioning laser, the intensifier is turned off 90 and a subroutine, which has been called *EXPOSE, is called to expose the red stripes of the input filter 92.

Referring to FIG. 4, after starting 94, the *EXPOSE subroutine initializes the target subpixels of the CCD to be the first stripe of a selected color 96. For example, if it is desired that the red stripes of the input filter are to be exposed first and red tinted photoresist is employed as the filter media, the input screen will be coated with red photoresist and based upon the representative sample garnered during the *CRESPOSAR subroutine, the location and composition of the first stripe of red CCD subpixels is identified and this stripe becomes the target stripe. The target stripe has a lateral position in the CCD array i and a vertical position j. Having identified the first stripe to be exposed, the coordinates for the first subpixel of that stripe (i,j) are identified 98. The exposure laser coordinates (x,y) corresponding to the desired subpixel are calculated based upon the stored position array which was previously garnered in *CRESPOSAR and by using linear interpolation points which were not tested during *CRESPOSAR can be ascertained 100. The exposure laser is then positioned at the (x,y) coordinates which have been determined in step 100, 102. Of course, whenever either the positioning laser or the exposing laser is positioned at a particular input screen coordinate (x,y), this is accomplished by moving the $I^2$ on an x-y stage or by deflecting the beams using the actuating motors 23 and 25 or 24 and 26 with feedback from the corresponding transducers controlling those actuating motors. If the exposure laser is not already on, it is turned on in step 104 and this results in the exposure of the subpixel (i,j) associated with the input filter pixel located at (x,y). In order to expose the next input pixel which would correspond to the next CCD subpixel in strip i, displacement j along the CCD subpixel stripe is incremented at 106. A test is then performed to determine whether or not the entire stripe has been exposed 108. If not, the next position (x,y) is exposed as before until the entirety of the stripe has been processed. Upon completion of the exposure of the stripe, the exposure laser is turned off 110 and the next stripe to be exposed becomes the target stripe by incrementing i 112. This continues until all the stripes of the selected color are exposed 114 whereupon the subroutine returns 116 to the calling program. After having returned from the exposure of the red stripes during the *EXPOSE subroutine in FIG. 4, the green stripes are then exposed 118 followed by the blue stripes and the processing is concluded at 122. Of course it does not matter which color stripes are exposed first.

In accordance with a third method of the present invention, a small sample of test points is used to produce an approximate mapping between laser transducer coordinates (which have a one-to-one correspondence with the positions of illumination of the laser on the input screen of the $I^2$ device 10) and CCD subpixel locations (and color identity). The approximate mapping is refined during the use of the mapping in light of actual results such that a scanning path associated with a particular filter stripe is determined. As before, a fully functioning electronic output $I^2$ device 10 is put on an optical bench where it can be scanned by one or more lasers 18, 20. The computer positions the locating laser 18 on a few points on the faceplate of the $I^2$ 10, and at each point pulls the frame from the CCD 12 to determine the precise location. From these points the computer 22 generates an approximate mapping between the scan transducer positions and the CCD 12. This map does not include all the distortion effects. The computer 22 then hunts for a specific subpixel (such as the red subpixel on row 1, column 1) by using the approximate mapping as the first guess, followed by successive approximations based on frames pulled from the CCD 12. The computer then maps a path along the first stripe using feedback from the CCD 12. The exposure laser 20 is turned on and scanned to follow this path. The process is repeated for all stripes. H Various algorithms can be applied to efficiently determine the next stripe path based on the previous paths adjusted by location feedback from the CCD.

This technique should require about the same amount of time as the mapping exposure technique. FIGS. 3 and 5-7 show an exemplary flowchart of the third technique in accordance with this invention. The call to *CRESPOSAR subroutine, FIG. 3 by the main program for the third method (FIG. 5) assumes a parameter which is passed to the subroutine that determines the number of array points which are mapped. In the third method, a much smaller sampling is made during execution of the subroutine. It should be noted that the main program of the third method calls subroutine *CRESTVEC on FIG. 6 and *EXPOSEMAP on FIG. 7.

Figure 5:
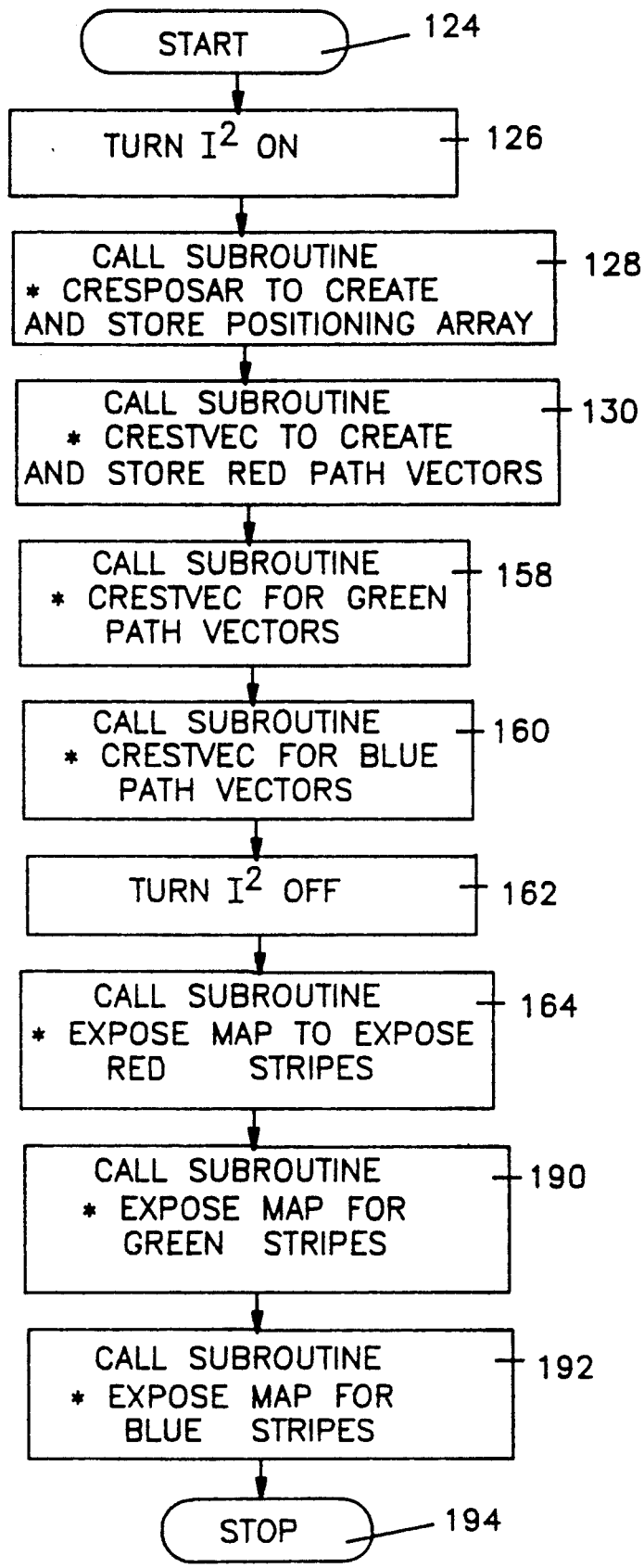
FIG. 5 is a flowchart setting forth exemplary steps for performing a third method in accordance with the present invention, i.e., the mapped path exposure technique.

Referring to FIG. 5, the mapped path exposure technique starts 124 and the intensifier is turned on 126. The subroutine *CRESPOSAR is called to create and store a positioning array of correspondence between positions (x,y) on the input screen/input filter with CCD subpixels at locations (i,j). This is done in step 128. In this instance, the call to *CRESPOSAR utilizes parameters that are passed to that subroutine which would specify the increments of x and y that occur in steps 76 and 80 of FIG. 3 to provide for a much smaller sample than was used in the mapping exposure technique referred to above. Having created a positioning array, another subroutine which has been called *CRESTVEC is called at 130 to create and store red path vectors which will correspond to the paths required to expose the input filter stripes corresponding to stripes of contiguous CCD subpixels having a red identity.

Figure 6:
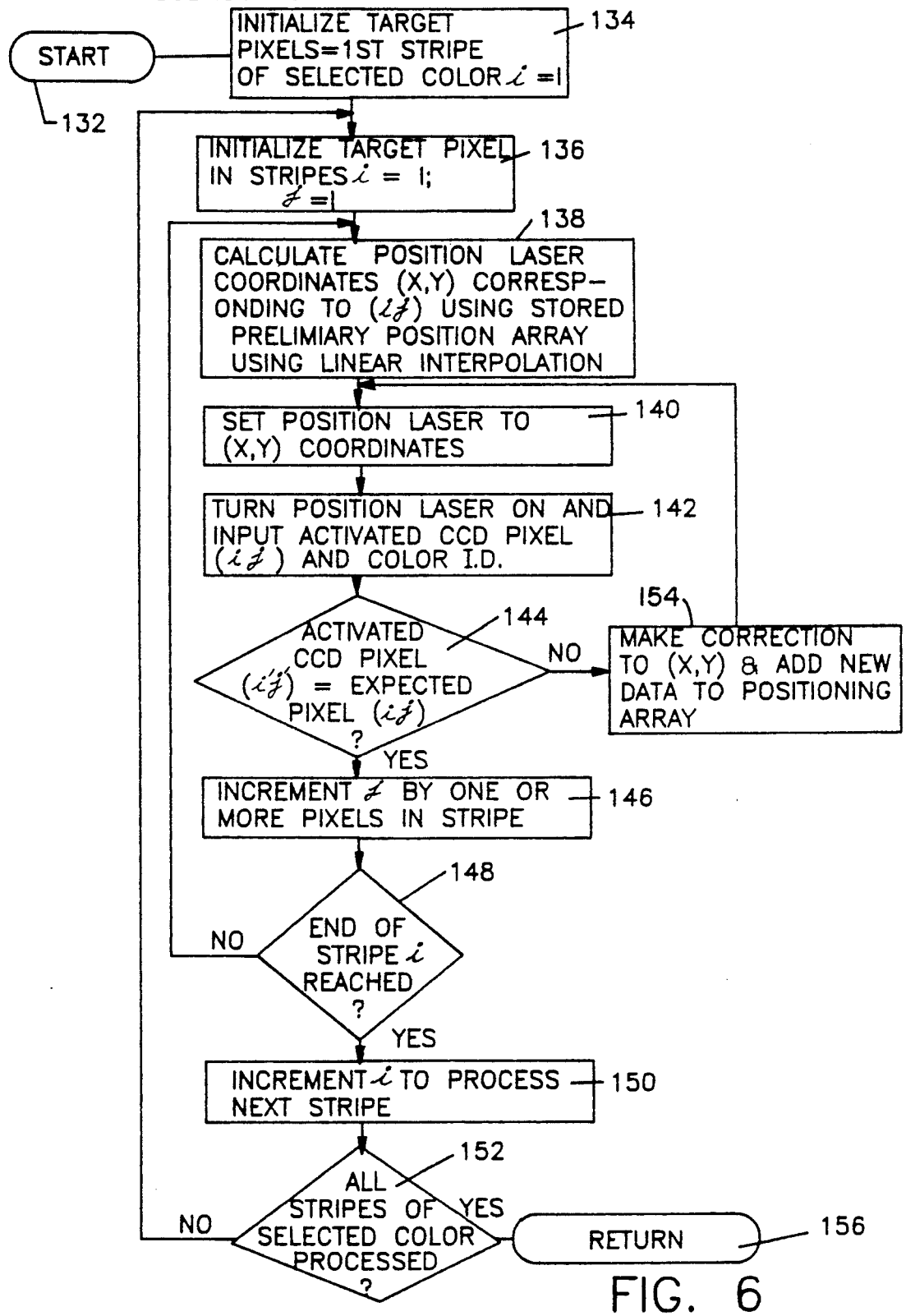
FIGS. 6 and 7 are flowcharts of subroutines called out by the flowchart in FIG. 5.
Figure 7:
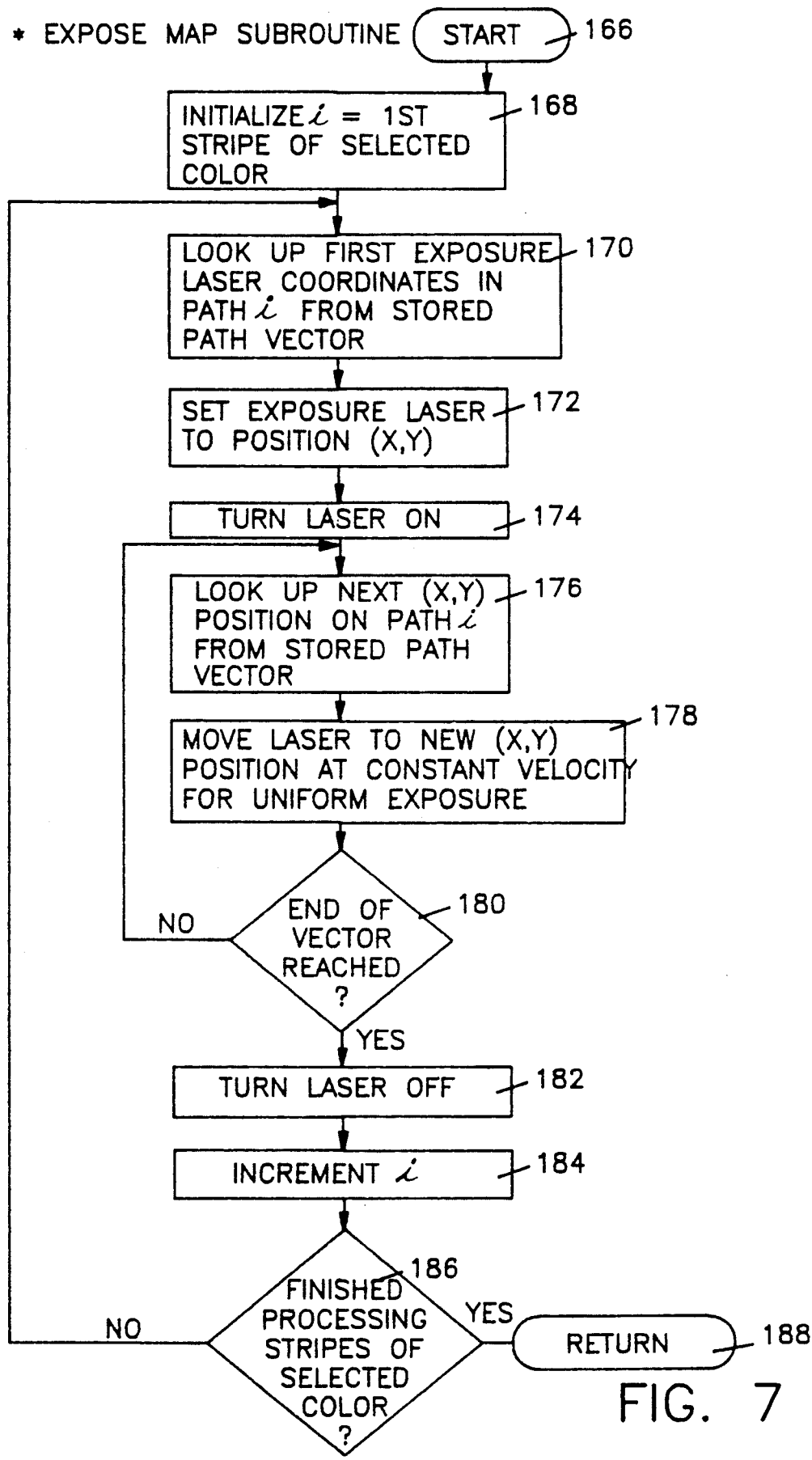

Referring to FIG. 6, after starting 132, the *CRESTVEC subroutine initializes the target pixels of the first stripe of the selected color which, in the example given, is red. Similarly to the initialization performed in the *EXPOSE subroutine at steps 96 and 98, in *CRESTVEC, this initialization is performed at 134 and 136. After initialization, the exposure laser coordinates (x,y) corresponding to the target subpixel in the CCD array is calculated based upon the correspondence array which has been created by the previous call to the *CRESPOSAR subroutine. Through the process of linear interpolation, the correlation of points which were not actually sampled is calculated 138. The positioning laser is focused upon the (x,y) coordinates calculated in step 138, 140 and the laser is turned on resulting in the activation of a particular CCD subpixel located at position (i,j) and having a particular color identification 142. It is then checked whether or not the activated pixel, here denominated (i', j'), is equal to the expected pixel (i,j) which was the target pixel defined in step 136, this occurring in step 144. If the activated pixel is the expected pixel, the j coordinate along strip i is incremented by one or more positions 146. The size of the increments is variable depending upon the degree of precision which is required and the corresponding amount of time for accomplishing that particular precision. The size of the increment can also be effected based upon feedback as to the discrepancy between the expected position and the acquired position, that is, the position of the activated pixel vs. the target pixel. If the difference of the position of the activated and expected pixel is routinely small, then the increment can be increased. A check is made if the end of the target stripe i has been reached 148. If it has, the next stripe is selected for processing 150 until the entirety of the stripes are processed 152. In the eventuality at 144 that the activated CCD subpixels are not the expected or target subpixel, a correction is made to the correlation array between the (x,y) input screen/input filter positions and the CCD subpixel positions (i,j) and color identity, this new data being used to correct the position array which was created previously by the call to *CRESPOSAR 154.

After all subpixels of the CCD array are processed, the *CRESTVEC subroutine returns to the calling program 156. After the color stripe position arrays, (color path vectors) are determined for the first color, which in this case was red, the path vectors are determined for the green and the blue stripes 158, 160 in FIG. 5. The intensifier is then turned off 162 and a subroutine *EXPOSEMAP is called 164 to expose the red filter stripes. After entry into the *EXPOSEMAP subroutine 166, the first stripe of the selected color, in this case red, generates the initial target position (i,j) of the CCD subpixel array. The exposure coordinates corresponding to stripe i of the target stripe are looked up from the stored path vector generated in the *CRESTVEC subroutine 170 and the exposure laser is positioned at the resulting (x,y) input coordinate 172. The exposure laser is then turned on 174 resulting in exposure of the input filter at coordinate (x,y). The next (x,y) position on the path filter stripe i is calculated based upon the stored path vector generated in the *CRESTVEC subroutine 176 and the laser is moved to the new (x,y) position at a constant velocity for uniformed exposure of the light sensitive filter media at 178. Since the processing is conducted at electronic speeds, the movement of the laser can be such as to approximate a continuous, smooth motion. A check is then performed to determine if the end of the vector corresponding to stripe i has been reached. If it has not, the next (x,y) position is determined based upon the stored path vector 176 and this position is then exposed until the end of the vector has been reached 180. The exposure laser is then turned off 182 and the stripe is incremented to process the next filter stripe of the selected color 184. A check is then performed to determine if all the stripes have been processed 186. If not, the remainder are processed. If they have all been processed, the subroutine returns control 188 to the calling program. Having completed the exposure of the red stripes, the main program on FIG. 5 repeats a call to the *EXPOSEMAP subroutine for the green stripes 190 and for the blue stripes 192 and then concludes 194.

Note that the order of steps in FIG. 5 is not cited. For example, exposure of red stripes 164 can follow mapping of red stripes 130, before the mapping of green stripes 158 and blue stripes 160.

A self-aligned process has been described for applying color filters to the input of an image intensifier for the purpose of producing an electronic output color $I^2$. Such a technique is required because of the difficulty in making registration between the input filters and the CCD, especially in the face of demagnification and distortion. The technique uses a locating laser and position feedback from the CCD to direct an exposure laser across the input focal plane, to expose color filters by photographic methods.

This technique could be applied to fabrication of other self-aligned filters on the input of electronic output $I^2$ devices, such as color mosaic filters or masking filters, as well as the stripe filters discussed above.

It should be understood that the embodiments described herein are merely exemplary and that a person skilled in the art may make many variations and modifications without departing from the spirit and scope of the invention as defined in the appended claims.

We claim:

1. A method for fabricating a color filter for an input of a color image intensifier with a CCD output, comprising the steps of:
   (a) ascertaining CCD subpixel-to-input coordinate correlation by irradiating points on said input with a source of light while said intensifier is operating and observing which CCD subpixels are activated;
   (b) providing a light sensitive media in a position proximate to said input;
   (c) selectively exposing said light sensitive media in accordance with said correlation ascertained; and
   (d) developing said light sensitive media.

2. The method of claim 1, wherein said step of providing a light sensitive media is performed prior to said step of ascertaining, said source of light irradiating said points on said input through said light sensitive media without exposing it.

3. The method of claim 1, wherein said step of exposing includes projecting light from a laser upon areas of said light sensitive media to be exposed.

4. The method of claim 3, wherein said step of irradiating is performed by a laser.

5. The method of claim 4, wherein said step of irradiating is performed by a first laser with insufficient power to expose said light sensitive media and said step of exposing is performed by a second laser having sufficient power to expose said light sensitive media.

6. The method of claim 5, wherein said color filter passes at least two colors through discrete portions thereof.

7. The method of claim 6, wherein said input and said first and second lasers are positionable with respect to each other so that said lasers are projected upon a range of (x,y) coordinate points on said input.

8. The method of claim 7, wherein said first and second lasers are aligned prior to said step of exposing light sensitive media.

9. The method of claim 8, wherein said steps of ascertaining and exposing are performed sequentially for each (x,y) coordinate on said input during a raster scan of said input by said lasers.

10. The method of claim 9, wherein said step of exposing is contingent upon CCD subpixel color identification revealed during said step of ascertaining.

11. The method of claim 10, wherein said color filter passes red, green and blue light, said CCD subpixels comprising one pixel are three in number and generate output signals indicative of red, green and blue light respectively, said light sensitive media is tinted photoresist and further including the step of coating said input with red, green and blue tinted photoresist prior to said steps of ascertaining and exposing, each photoresist shade being applied, exposed and developed independently of the other shades.

12. The method of claim 11, wherein said intensifier is ON when said step of ascertaining is performed and OFF when said step of exposing is performed.

13. The method of claim 10, wherein said color filter passes red, green and blue light, said CCD subpixels comprising one pixel are three in number and generate output signals indicative of red, green and blue light respectively, said light sensitive media is color film having the capacity to develop red, green and blue, and said second laser is a set of three discrete lasers emitting red, green and blue light, respectively.

14. The method of claim 8, wherein said step of ascertaining is performed for a representative subset of (x,y) input coordinate/CCD subpixel correlatable pairs prior to said step of exposing.

15. The method of claim 14, wherein the correlation between correlatable pairs not included in said representative subset are calculated by interpolation during said step of exposing, data from said step of ascertaining being stored.

16. The method of claim 15, wherein said step of exposing is conducted in a raster scan.

17. The method of claim 15, wherein said step of exposing is conducted by exposing contiguous stripes of media corresponding to CCD subpixels of a particular color.

18. The method of claim 15, wherein said representative subset has elements numbering in a range of approximately 1% to 10% of the entire set.

19. The method of claim 8, wherein said step of ascertaining results in the ascertainment of a correlation array set numbering less than 1% of all (x,y) input coordinate/CCD subpixel correlatable pairs, and further including the steps of calculating the locations of correlatable pairs based upon said correlation array and upon linear interpolation, testing the accuracy of said calculated correlations by irradiating points on said input of an operating said intensifier with a source of light and observing which CCD subpixels are activated and adding correlation data acquired from said testing to said correlation array.

20. The method of claim 19, wherein said calculating is performed in an order determined by the lineup of CCD pixels of like-color so that the (x,y) input coordinates are determined for a first row of like-colored CCDs, one subpixel at a time, then for the next row, until all rows are correlated.

21. The method of claim 20, wherein said exposure is performed line by line such that a filter stripe is formed corresponding to each of said like-colored rows of the CCD.

22. The method of claim 21, wherein said exposure along said stripes is conducted at a uniform velocity to yield a substantially uniform filter stripe.

23. The method of claim 8, wherein said light sensitive media is color film having the capacity to develop red, green and blue, and said second laser is a set of three discrete lasers emitting red, green and blue light, respectively, said color film developing red, green and blue, respectively, during said step of developing at locations previously exposed to said red, green and blue light of said three distinct lasers.

24. The method of claim 8, wherein said first and second lasers are aligned prior to said steps of ascertaining and exposure by irradiating the input screen of an operating said intensifier with said first and said second lasers and sensing on and recording the resultant CCD pixel which is activated by each.

25. The method of claim 24, wherein said alignment further includes creating a table of correlations between said first laser position and said second laser position such that a common focal point can be looked up for focusing both lasers on the same input coordinate.

26. The method of claim 8, wherein said light sensitive media is positive acting photoresist.

27. The method of claim 8, wherein said light sensitive media is negative acting photoresist.

28. The method of claim 5, wherein said steps of ascertainment and exposure are controlled by a computer.

29. The method according to claim 1, wherein said step of ascertaining includes irradiating points on said input with a later unit having a changeable filter thereon to select a laser intensity and wavelength with insufficient power to expose said light sensitive media and said step of exposing is performed by said laser unit having a changeable filter thereon to select a laser intensity and wavelength with sufficient power to expose said light sensitive media.

30. The method of claim 1, wherein said step of providing said light sensitive media is performed after said step of ascertaining.

* * * * *